US009035699B2

(12) United States Patent
Dhanasekaran (10) Patent No.: US 9,035,699 B2
(45) Date of Patent: May 19, 2015

(54) MULTI-STAGE AMPLIFIER (71) Applicant: QUALCOMM Incorporated, San Diego, CA (US)

(72) Inventor: Vijayakumar Dhanasekaran, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 89 days.

(21) Appl. No.: 13/720,884

(22) Filed: Dec. 19, 2012

(65) Prior Publication Data

US 2014/0167860 A1 Jun. 19, 2014

(51) Int. Cl.
H03F 3/26 (2006.01)
H03F 1/02 (2006.01)
H03F 3/30 (2006.01)
H03F 3/45 (2006.01)

(52) U.S. Cl.
CPC ............ H03F 1/0227 (2013.01); H03F 3/3022 (2013.01); H03F 3/45183 (2013.01); H03F 3/45475 (2013.01); H03F 2200/408 (2013.01); H03F 2200/513 (2013.01)

(58) Field of Classification Search
USPC .................................. 330/270, 297, 296, 285
See application file for complete search history.

(56) References Cited

U.S. PATENT DOCUMENTS 7,295,074 B2 * 11/2007 Wong et al. .................... 330/295
7,557,658 B2   7/2009 Perez
7,642,855 B2 * 1/2010 Van Zanten .................... 330/292
7,683,715 B2   3/2010 Singh
7,733,178 B1   6/2010 Delano et al.
7,872,531 B1   1/2011 Dhanasekaran
8,149,056 B2   4/2012 Pontarollo et al.
8,649,744 B2 * 2/2014 Acimovic .................. 455/114.3
2012/0092071 A1   4/2012 Mazet et al.

FOREIGN PATENT DOCUMENTS

GB          2484475 A     4/2012

OTHER PUBLICATIONS

International Search Report and Written Opinion—PCT/US2013/076748—ISAEPO—Mar. 20, 2014.
Li Y., et al., "Design of High Efficiency Monolithic Power Amplifier With Envelope-Tracking and Transistor Resizing for Broadband Wireless Applications", IEEE Journal of Solid-State Circuits, Service Center, Piscataway, NJ, USA, vol. 47, No. 9, Sep. 1, 2012, pp. 2007-2018, XP011457923, ISSN: 0018-9200, DOI: 10.1109/JSSC.2012.2201289 the whole document.

* cited by examiner

Primary Examiner — Henry Choe
(74) Attorney, Agent, or Firm — Ramin Mobarhan (57) ABSTRACT Exemplary embodiments are directed to operating a multi-stage amplifier with low-voltage supply voltages. A multi-stage amplifier may include a first path of an amplifier output stage configured to convey an output signal if a first supply voltage is greater than a threshold voltage. The multi-stage amplifier may also include a second path of the amplifier output stage configured to convey the output signal if the first supply voltage is less than or equal to the threshold voltage.

20 Claims, 7 Drawing Sheets

MULTI-STAGE AMPLIFIER

BACKGROUND

1. Field

The present invention relates generally to electronic amplifiers. More specifically, the present invention includes embodiments related to low voltage multi-stage amplifiers.

2. Background

Wireless communication systems are widely deployed to provide various types of communication content such as voice, video, data, and the like. These systems may be multiple-access systems capable of supporting simultaneous communication of multiple wireless communication devices with one or more base stations.

Wireless communication devices are typically powered by batteries. As the functionality of wireless communication devices becomes more complicated, so has the desire for wireless communication devices to maximize battery life. By reducing the power consumption of a wireless communication device, the battery life may be increased. One way to reduce power consumption is to use more efficient amplifiers within wireless communication devices. For example, amplifiers that use lower supply voltages may be more efficient than amplifiers that use higher supply voltages. Benefits may be realized by an amplifier that uses lower supply voltages while providing necessary gains.

A need exists for reducing power consumption of a multi-stage amplifier. More specifically, a need exists for embodiments for reducing supply voltages of an output stage of a multi-stage amplifier.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

Exemplary embodiments, as described herein, are directed to embodiments for minimizing supply voltages of an output stage of a multi-stage amplifier and, thus enhancing voltage efficiency of the multi-stage amplifier. According to various exemplary embodiments of the present invention, a multi-stage amplifier may include an output stage configured for operation at low supply voltages (e.g., +/−0.1 volt). By way of example only, an output stage may include a first transistor coupled to a positive supply voltage and an output, and a second transistor coupled to a negative supply voltage and the output. The output stage may also include a third transistor having a first terminal coupled to a first terminal of the first transistor and a second terminal coupled to a second terminal of the first transistor and configured to be activated if the positive supply voltage is below a threshold value.

Figure 1:
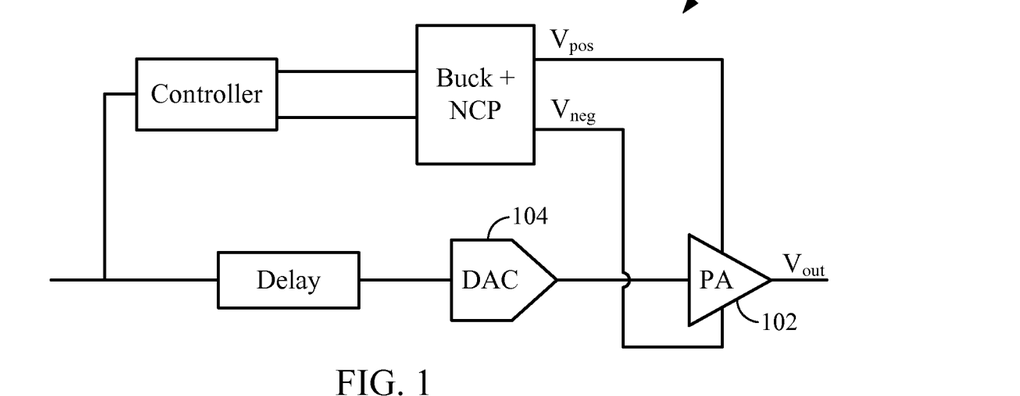
FIG. 1 is a device including an amplifier configured to receive a positive supply voltage and a negative supply voltage.
Figure 2:
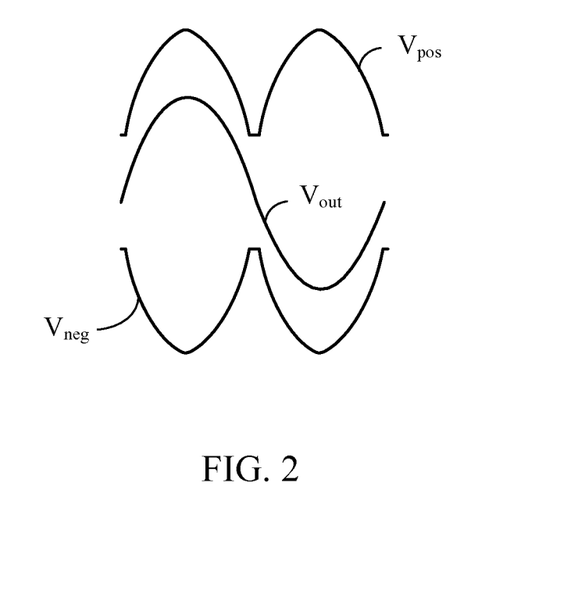
FIG. 2 is a plot illustrating waveforms of a positive supply voltage for an amplifier and a negative supply voltage for the amplifier.

FIG. 1 is a block diagram of a device 100 including a power amplifier (PA) 102 configured to receive an analog signal from a digital-to-analog converter (DAC) 104. Further, PA 102 is configured to receive a positive supply voltage $V_{pos}$ and a negative supply voltage $V_{neg}$, and output an output voltage $V_{OUT}$. FIG. 2 illustrates the waveforms of positive supply voltage $V_{pos}$, negative supply voltage $V_{neg}$ and output voltage $V_{OUT}$ of an amplifier. As will be understood by a person having ordinary skill in the art, a power output stage of a conventional amplifier (e.g., a power amplifier) may require a positive supply voltage (e.g., positive supply voltage $V_{pos}$) of approximately 0.9 volts or more and a negative supply voltage (e.g., negative supply voltage $V_{neg}$) of approximately −0.9 volts or less.

Figure 3:
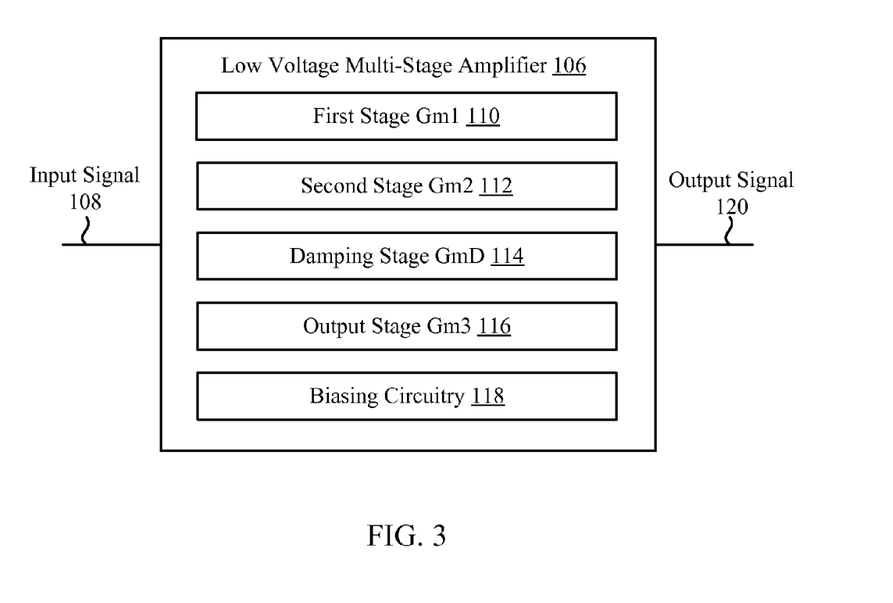
FIG. 3 is a block diagram illustrating a multi-stage amplifier.

FIG. 3 is a block diagram illustrating a multi-stage amplifier 106, which may comprise a class-AB amplifier, a class G amplifier, a class H amplifier, a rail switching amplifier, an amplifier with an infinitely variable supply rail, or any combination thereof. Further, multi-stage amplifier 106 may comprise an op-amp, a power amplifier, a distribution amplifier, or any combination thereof. Power amplifier 102, as illustrated in FIG. 1, may comprise multi-stage amplifier 106.

Multi-stage amplifier 106 includes multiple amplification stages. More specifically, for example, multi-stage amplifier 106 includes a first stage Gm1 110, a second stage Gm2 112, a damping stage GmD 114 and an output stage Gm3 116. Multiple amplification stages may allow multi-stage amplifier 106 to amplify an input signal 108 and generate an amplified output signal 120 with minimal distortion and minimal power consumption.

Class-B amplifiers may amplify only half of the wave cycle of an input signal 108. At the expense of increased distortion, class-B amplifiers have high efficiency (i.e., because the amplifying element of a class-B amplifier is switched off half the time), resulting in reduced power consumption. By using complementary pairs, multiple class-B amplifiers may be used to amplify both halves of an input signal, thereby reducing distortion. However, complementary pairs of class-B amplifiers may suffer from crossover distortion, where increased distortion is experienced when one of the class-B amplifiers is turning off and another class-B amplifier is turning on.

One way to eliminate crossover distortion is the use of a class-AB amplifier. In class-AB amplifiers, each device may amplify half of the signal and conduct a relatively small amount during the other half (i.e., rather than shutting off). An amount of distortion is dependent on a standing current through both devices when there is no signal (i.e., the quiescent current). The quiescent current is directly dependent on the bias voltage. A class-AB amplifier has a lower efficiency than a class-B amplifier, but has increased linearity.

Class-G and class-H amplifiers enhance class-AB output stages by obtaining increased efficiency without increasing distortion. In class-G amplifiers, rail switching is used to increase the efficiency and different supply voltages may be used to accommodate swings in output signal 120. Typically, rail switching is used in output stage Gm3 116, since the output stage Gm3 116 experiences the largest current swing and can thus obtain the largest increases in efficiency. For class-G amplifiers, multiple discrete supply voltages may be used. For class-H amplifiers, infinitely variable supply voltages may be used by matching the supply voltage to output signal 120. Matching the supply voltage to output signal 120 may sometimes be referred to as envelope tracking.

Multi-stage amplifier 106 may further include biasing circuitry 118, which may set a quiescent current of the output stage Gm3 116, thereby supplying the minimum headroom required for proper operation of output stage Gm3 116. As will be described more fully below, biasing circuitry 118 may provide control voltages to output stage Gm3 116 via damping stage GmD 114.

Figure 4:
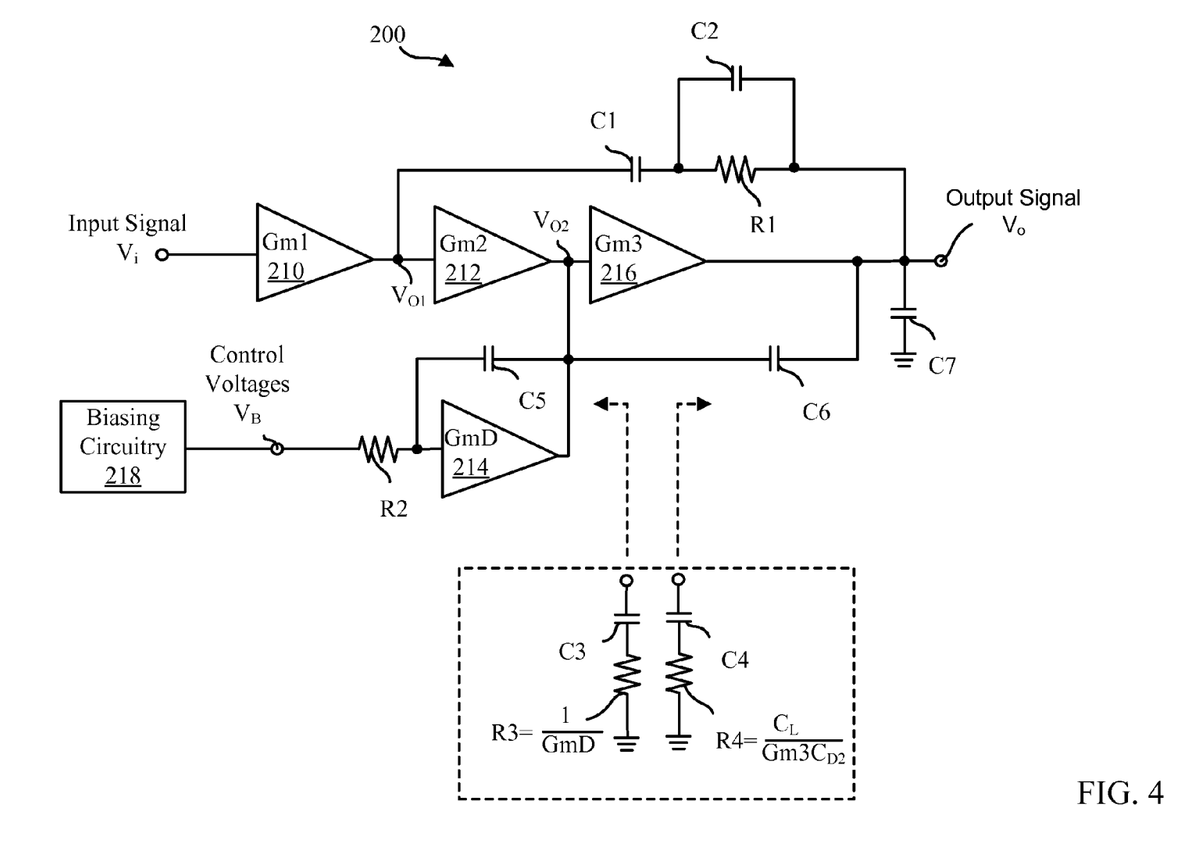
FIG. 4 illustrates a multi-stage amplifier.

FIG. 4 is a block diagram illustrating a multi-stage amplifier 200, according to an exemplary embodiment of the present invention. For example only, multi-stage amplifier 200 may comprise multi-stage amplifier 106 of FIG. 3. Multi-stage amplifier 200 may include biasing circuitry 218, a first stage Gm1 210, a second stage Gm2 212, a damping stage GmD 214 and an output stage Gm3 216. First stage Gm1 210 may receive an input signal $V_i$ and output a voltage $V_{O1}$, which may be provided to an input of the second stage Gm2 212. Second stage Gm2 212 may output a voltage $V_{O2}$, which may be provided to an input of output stage Gm3 216. Output stage Gm3 216 may output an output signal $V_O$. An output of the output stage Gm3 216 may be coupled to a reference voltage, which may comprise a negative supply voltage, via a capacitor C7.

An output of the first stage Gm1 210 may also be coupled to a capacitor C1, which may be coupled to both a resistor R1 and a capacitor C2 in parallel. Further, resistor R1 and capacitor C2 may be coupled to the output of output stage Gm3 216. An output of second stage Gm2 212 may further be coupled to each of an output of output stage Gm3 216 via a capacitor C6 an output of damping stage GmD 214. The output of second stage Gm2 212 may also be coupled to an input of damping stage GmD 214 via a capacitor C5.

An output of biasing circuitry 218 may be coupled to the input of damping stage GmD 214 via a resistor R2, and may output control voltages $V_B$. Additional feedback (not shown in FIG. 4) to biasing circuitry 218 may be used to facilitate the generation of control voltages $V_B$, which are passed through resistor R2 and damping stage GmD 214, may generate the proper quiescent current needed for operation of output stage Gm3 216.

An impedance from the output of damping stage GmD 214 toward an input of damping stage GmD 214 may be approximated by a capacitor C3, which is coupled to a resistor R3 that is further coupled to a negative supply voltage. An impedance from the output of damping stage GmD 214 toward the output of multi-stage amplifier 200 may be approximated by a capacitor C4, which is coupled to a resistor R4 that is further coupled to the negative supply voltage. A damping circuit formed by damping stage GmD 214, resistor R2 and capacitor C5 emulates a damping resistance of $$R3 \approx \frac{1}{GmD}$$

and an equivalent blocking capacitance of C3≈GmD*R2*C5.

Figure 5:
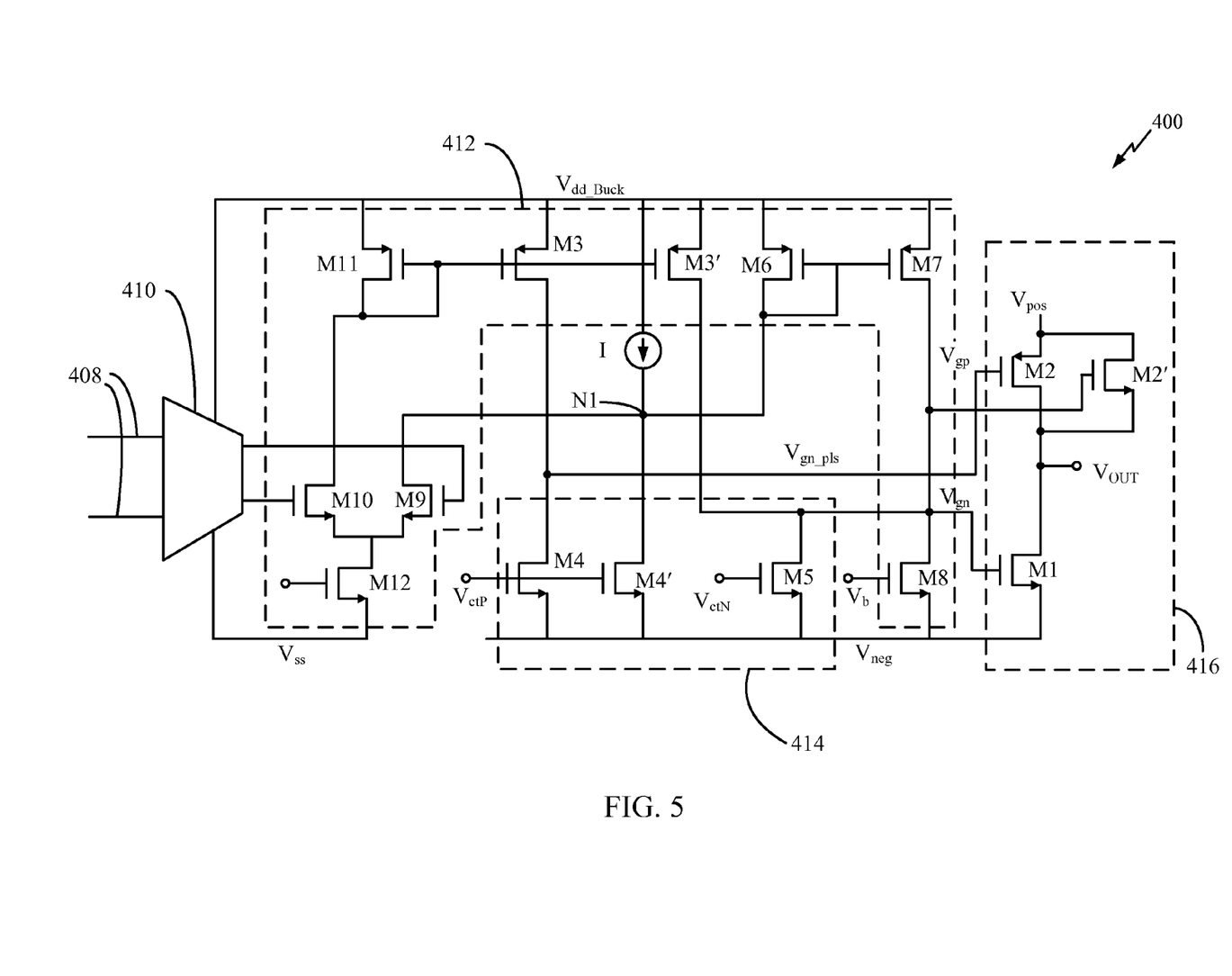
FIG. 5 illustrates a low voltage multi-stage amplifier, according to an exemplary embodiment of the present invention.

FIG. 5 is a circuit diagram illustrating a multi-stage amplifier 400, in accordance with an exemplary embodiment of the present invention. Multi-stage amplifier 400 may comprise multi-stage amplifier 106 illustrated in FIG. 3. Multi-stage amplifier 400 includes a first stage 410, a second stage 412, a damping stage 414, and an output stage 416. Multi-stage amplifier 400 may also include biasing circuitry 500 (not shown in FIG. 5; see FIG. 6). A control voltage $V_{ctP}$ and a control voltage $V_{ctN}$ may be provided from biasing circuitry 500 (see FIG. 6).

First stage 410, which is coupled to a positive supply voltage $V_{dd\_Buck}$ and a negative supply voltage $V_{ss}$, may receive an input signal 408. According to one exemplary embodiment, positive supply voltage $V_{dd\_Buck}$ and supply voltage $V_{ss}$ (e.g., ground voltage or a negative supply voltage) may comprise an analog supply (i.e., that does not vary according to an output signal $V_{OUT}$). An output of first stage 410 may be coupled to a current mirror including a p-channel transistor M11 and an n-channel transistor M10. A source of p-channel transistor M11 may be coupled to positive supply voltage $V_{dd\_Buck}$ and a gate of p-channel transistor M11 may be coupled to a drain of p-channel transistor M11. A drain of p-channel transistor M11 may also be coupled to a drain of n-channel transistor M10. Further, a source of n-channel transistor M10 may be coupled to a drain of an n-channel transistor M12, and a gate of n-channel transistor M10 may be coupled to an output of first stage 410. A gate of n-channel transistor M12 is configured to receive a bias voltage and a source of n-channel transistor M12 is coupled to negative supply voltage $V_{ss}$. Moreover, amplifier 400 includes an n-channel transistor M9 having a gate coupled to an output of first stage 410, a drain coupled to a node N1, and a source coupled to a source of n-channel transistor M10 and a drain of n-channel transistor M12.

Second stage 412 may include a p-channel transistor M3 and a p-channel transistor M3'. A source of p-channel transistor M3 and a source of p-channel transistor M3' may each be coupled to positive supply voltage $V_{dd\_Buck}$. Furthermore, a gate of p-channel transistor M3 and a gate of p-channel transistor M3' may each be coupled to a gate of p-channel transistor M11.

Damping stage 414 may be a current source and a damping stage for output stage 416. Thus, damping stage 414 may also be referred to as a supply stage. Damping stage 414, which may provide necessary damping for multi-stage amplifier 400, may also be reused as a current source for second stage 412. Damping stage 414 may include an n-channel transistor M4, an n-channel transistor M4', and n-channel transistor M5. It is noted that damping stage 414 may also include various capacitors and/or resistors coupled to one or more of n-channel transistor M4, an n-channel transistor M4', and n-channel transistor M5. A gate of n-channel transistor M4 and a gate of n-channel transistor M4' may be coupled to control voltage $V_{ctP}$, and a gate of the n-channel transistor M5 may be coupled to control voltage $V_{ctN}$. Control voltage $V_{ctP}$ and control voltage $V_{ctN}$, which may be provided by biasing circuitry 500 (see FIG. 6), may set the quiescent current needed for proper operation of output stage 416.

A drain of n-channel transistor M4 may be coupled to a drain of p-channel transistor M3 and a source of n-channel transistor M4 may be coupled to a variable negative supply voltage $V_{neg}$. A drain of n-channel transistor M4' may be coupled to a current source I, which is further coupled to positive supply voltage $V_{dd\_Buck}$. A source of n-channel transistor M4' may be coupled to a variable negative supply voltage $V_{neg}$. Further, a drain of n-channel transistor M5 may be coupled to a drain of p-channel transistor M3' and a source of n-channel transistor M5 may be coupled to variable negative supply voltage $V_{neg}$.

Output stage 416 may include a p-channel transistor M2 and an n-channel transistor M1. A source of p-channel transistor M2 may be coupled to a variable positive supply voltage $V_{pos}$ and a drain of p-channel transistor M2 may be coupled to a drain of n-channel transistor M1. A drain of p-channel transistor M2 may also be coupled to output signal $V_{OUT}$ and a gate of p-channel transistor M2 may be coupled to a drain of n-channel transistor M4 of damping stage 414. A voltage $V_{gp}$ at a gate of p-channel transistor M2 may be provided to biasing circuitry 500 (see FIG. 6). A source of n-channel transistor M1 may be coupled to variable negative supply voltage $V_{neg}$ and a gate of n-channel transistor M1 may be coupled to the drain of n-channel transistor M5 of damping stage 414 and a drain of p-channel transistor M3'. A voltage $V_{gn}$t the gate of n-channel transistor M1 may be provided to biasing circuitry 500 (see FIG. 6).

Output stage 416 further includes an n-channel transistor M2' having a drain coupled to variable positive supply voltage $V_{pos}$, and a source coupled to each of output signal $V_{OUT}$ and the drain of n-channel transistor M1. Accordingly, output stage 416 includes an output path including p-channel transistor M2 and n-channel transistor M1 and another output path including n-channel transistor M2' and n-channel transistor M1, wherein n-channel transistor M2' is in parallel with p-channel transistor M2.

A gate of n-channel transistor M2' is coupled to each of a drain of a p-channel transistor M7 and a drain of an n-channel transistor M8. Moreover, a source of n-channel transistor M8 is coupled to variable negative supply voltage $V_{neg}$ and a gate of n-channel transistor M8 is configured to receive a control voltage $V_b$. In addition, a source of p-channel transistor M7 is coupled to positive supply voltage $V_{dd\_Buck}$, and a gate of p-channel transistor M7 is coupled to a gate of a p-channel transistor M6, which has a source coupled to positive supply voltage $V_{dd\_Buck}$. P-channel transistor M6 further includes a drain coupled to node N1 and a gate of p-channel transistor M6. It is noted that transistors M6, M7, M8, and M9 are configured to drive an output path including n-channel transistor M2' and n-channel transistor M1. It is further noted that n-channel transistor M4' provides a feedback bias current control path for n-channel transistor M2' and is configured to set the quiescent current for output stage 416.

As will be appreciated by a person having ordinary skill in the art, to achieve voltage efficiency, output stage 416 should be operated with minimum supply voltages. Further, due to high peak to average ratio, efficiency at low and mid range voltages is very important, thus very low voltage operation is desired. As will be appreciated by a person having ordinary skill in the art, the minimum headroom required for proper operation of p-channel transistor M2 and n-channel transistor M1 of multi-stage amplifier 400 is $V_{pos}-V_{neg}>Vgs_{M2}+Vdsat_{M4}$, where $Vgs_{M2}$ is the voltage from the gate to the source of p-channel transistor M2 and $Vdsat_{M4}$ is the minimum voltage from the drain to the source of n-channel transistor M4 required to meet saturation operation and, thus, prevent n-channel transistor M4 from operating in the triode region.

According to an exemplary embodiment of the present invention, if the supply voltages of amplifier 500 are reduced beyond a threshold value (i.e., reduced beyond values in which p-channel transistor M2 conducts), n-channel transistor M2' may be activated for continued operation of amplifier 500. For example, if $V_{pos}-V_{neg}<Vgs_{M2}+Vdsat_{M4}$, p-channel transistor M2 may be turned off, n-channel transistor M2' may be turned on and, thus, output stage Gm3 416 may continue operate with minimum supply voltages. As one example, n-channel transistor M2' and n-channel transistor M1 may each conduct when an absolute value of each of variable positive supply voltage $V_{pos}$ and variable negative supply voltage $V_{neg}$ is less than 0.40 volts. As yet a more specific example, n-channel transistor M2' and n-channel transistor M1 may each conduct when variable positive supply voltage $V_{pos}$ is substantially equal to 0.1 volt or more, and variable negative supply voltage $V_{neg}$ is substantially equal to −0.1 volt or less. It is noted that each of n-channel transistor M2' and n-channel transistor M1 may conduct even if variable positive supply voltage $V_{pos}$ and variable negative supply voltage $V_{neg}$ are substantially equal to zero. Accordingly, no minimum values for variable positive supply voltage $V_{pos}$ and variable negative supply voltage $V_{neg}$ are required for biasing. As will be appreciated by a person having ordinary skill in the art, by reducing power supply rails in an amplifier 500, the power consumption of amplifier 500 may be reduced.

With reference to FIGS. 2 and 5, a power output stage of amplifier 400 may require a positive supply voltage (e.g., positive supply voltage $V_{pos}$) to be approximately 0.1 volt or more and a negative supply voltage (e.g., negative supply voltage $V_{neg}$) to be approximately −0.1 volt or less. However, as noted above, a path within output stage including n-channel transistor M2' and n-channel transistor M1 may conduct even if variable positive supply voltage $V_{pos}$ and variable negative supply voltage $V_{neg}$ are substantially equal to zero.

As will be appreciated by a person having ordinary skill in the art, amplifier 400 does not require a minimum supply voltage in output stage 416 and, therefore, in comparison to conventional amplifiers that may require +/−0.45 volt supply voltages, amplifier 400 may allow for a substantial (e.g., 4.5×) power reduction in output stage 416.

Figure 6:
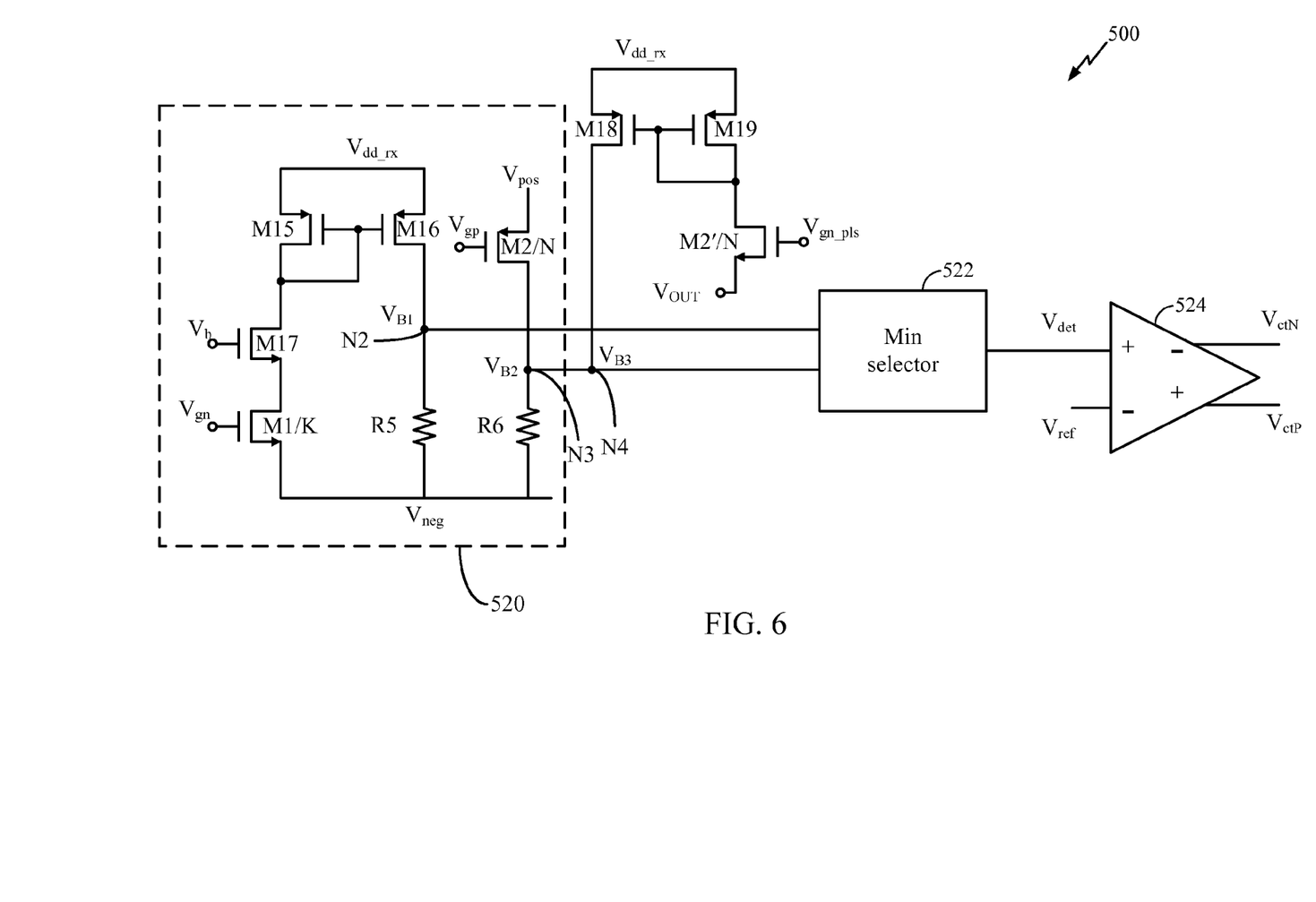
FIG. 6 illustrates biasing circuitry of a low voltage multi-stage amplifier, in accordance with an exemplary embodiment of the present invention.

As will be appreciated by a person having ordinary skill in the art, circuitry configured for biasing a multi-stage amplifier may be configured to maintain the quiescent current in an output stage of the multi-stage amplifier. FIG. 6 illustrates biasing circuit 500, in accordance with an exemplary embodiment of the present invention. Biasing circuit 500 is configured for generating control voltage $V_{ctN}$, which is conveyed to the gate of n-channel transistor M5 (see FIG. 5) and control voltage $V_{ctP}$, which is conveyed to the gate of n-channel transistors M4 and the gate of n-channel transistor M4'. It is noted that biasing circuit 500 may be utilized to set the quiescent current of output stage 416 and to set the transition between p-channel transistor M2 and n-channel transistor M2' in output stage 416. Biasing circuitry 518 includes a replica current stage 520, a minimum selector 522, and an error amplifier 524.

Replica current stage 520 may include a p-channel transistor M15, a p-channel transistor M16, a p-channel transistor M2/N, an n-channel transistor M17, and an n-channel transistor M1/K. A size of p-channel transistor M2/N may be substantially equal to a size of p-channel transistor M2 (see FIG. 5) divided by an integer N. A size of n-channel transistor M1/K may be substantially equal to a size of n-channel transistor M1 (see FIG. 5) divided by an integer K.

A source of p-channel transistor M15 and a source of p-channel transistor M16 may each be coupled to the positive rail voltage $V_{dd\_rx}$. Also, a gate of p-channel transistor M15 may be coupled to each of a gate of second p-channel transistor M16, a drain of p-channel transistor M15, and a drain of n-channel transistor M17. A gate of n-channel transistor M17 may be coupled to a voltage $V_b$, which may be an arbitrary voltage used to set the drain voltage of n-channel transistor M1/K. It is noted that voltage $V_b$ may be set such that the drain voltage of n-channel transistor M1/K is substantially close to the output voltage at zero signal condition (e.g., 0.0 V). A source of n-channel transistor M17 may be coupled to the drain of n-channel transistor M1/K and a gate of n-channel transistor M1/K may be coupled to a voltage $V_{gn}$, which may comprise voltage $V_{gn}$ of FIG. 5. A source of n-channel transistor M1/K may be coupled to variable negative supply rail $V_{neg}$.

A drain of p-channel transistor M16 may be coupled to variable negative supply voltage $V_{neg}$ via a resistor R5. A voltage at a drain of p-channel transistor M16 may comprise a bias voltage $V_{B1}$ at a node N2. As will be appreciated by a person having ordinary skill in the art, a current, which is a scaled version of a current that is conveyed through transistor M1 (see FIG. 5), is conveyed through resistor R5 to generate bias voltage $V_{B1}$ at node N2.

A source of p-channel transistor M2/N may be coupled to variable positive supply rail $V_{pos}$ and a gate of p-channel transistor M2/N may be coupled to a voltage $v_{gp}$, which may comprise voltage $V_{gp}$ of FIG. 5. A drain of p-channel transistor M2/N may be coupled to variable negative supply rail $V_{neg}$ via a resistor R6. A voltage at the drain of p-channel transistor M2/N may comprise a bias voltage $V_{B2}$ at a node N3. As will be appreciated by a person having ordinary skill in the art, a current, which is a scaled version of a current that is conveyed through transistor M2 (see FIG. 5), is conveyed through resistor R6 to generate bias voltage $V_{B2}$ at node N3.

In addition, according to an exemplary embodiment of the present invention, biasing circuit 500 includes an n-channel transistor M2'/N, a p-channel transistor M18 and a p-channel transistor M19. A drain of p-channel transistor M18 is coupled to a node N4 and a source of p-channel transistor M18 in coupled to positive rail voltage $V_{dd\_rx}$. Further, a source of p-channel transistor M19 is coupled to positive rail voltage $V_{dd\_rx}$, and a drain of p-channel transistor M19 is coupled to each of a gate of p-channel transistor M19 and a drain of n-channel transistor M2'/N. In addition, a gate of n-channel transistor M2'/N is coupled to a voltage $V_{gn\_pls}$ and a drain of n-channel transistor M2'/N is coupled to output voltage $V_{OUT}$. A size of p-channel transistor M2'/N may be substantially equal to a size of p-channel transistor M2' (see FIG. 5) divided by an integer N.

A voltage at the drain of p-channel transistor M18 may comprise a bias voltage $V_{B3}$ at a node N4. As will be appreciated by a person having ordinary skill in the art, a replica current, which is a scaled version of a current that is conveyed through transistor M2' (see FIG. 5), may be conveyed through resistor R6 to generate bias voltage $V_{B3}$ at node N4. It is noted that if both transistors M2 and M2' of FIG. 4 are conducting, a replica current generated via p-channel transistor M2'/N may be added to a replica current generated via p-channel transistor M2/N to generate a bias voltage, which exists at nodes N3 and N4.

The parallel current path via n-channel transistor M2'/N may ensure the positive side quiescent current (i.e., the current through one or more of n-channel transistor M2' and p-channel transistor M2) is maintained. Further, at relatively large negative voltage swings (e.g., the absolute value of $V_{neg}$ is greater than 0.5 V), the positive side quiescent current is set by p-channel transistor M2. At medium sized negative voltage swings (i.e., the absolute value of $V_{neg}$ is between 0.4-0.5 V), the positive side quiescent current is set by both p-channel transistor M2 and n-channel transistor M2'. At relatively low negative voltage swings (e.g., the absolute value of $V_{neg}$ is less than 0.4 V), the positive side quiescent current is set by n-channel transistor M2'.

Both generated bias voltages (i.e., bias voltage $V_{B1}$ and bias voltage $V_{B2}$, bias voltage $V_{B1}$ and bias voltage $V_{B3}$, or bias voltage $V_{B1}$ and a combination of bias voltages $V_{B2}$ and $V_{B2}$) may be provided to minimum selector 522. Minimum selector 522 may output a determined voltage $V_{det}$, which may be an average of the two received bias voltages, if the two bias voltages are relatively close (i.e., less than a saturation voltage of the transistors used in minimum selector 522 (referred to as a minimum selector transistor saturation voltage). If one bias voltage is much larger than the other bias voltage (e.g., when a class-AB amplifier is driving high current), minimum selector 522 may output the smaller bias voltage as the determined voltage $V_{det}$.

Determined voltage $V_{det}$ may be provided to error amplifier 460, which may compare the selected bias voltage (i.e., the determined voltage $V_{det}$) with a reference voltage $V_{ref}$ to set control voltage $V_{ctP}$ and control voltage $V_{ctN}$ based on negative feedback. Error amplifier 460 may thus output control voltage $V_{ctP}$ and control voltage $V_{ctN}$.

Figure 7:
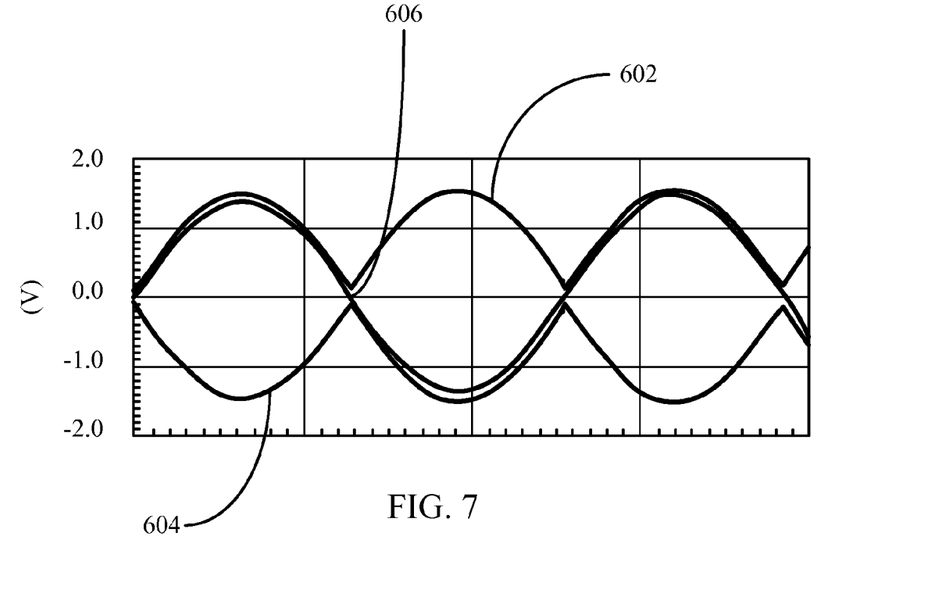
FIG. 7 is a plot illustrating simulation results of a multi-stage amplifier including an output stage configured for operating at low supply voltages.

FIG. 7 is a plot 600 illustrating simulation results of amplifier 400 utilizing a headroom of 0.1 volt. Waveform 602 depicts a variable positive supply rail (e.g., variable positive supply rail $V_{pos}$ of FIG. 5), waveform 604 depicts a variable negative supply rail (e.g., variable negative supply rail $V_{neg}$ of FIG. 5), and waveform 606 depicts an output voltage (e.g., output voltage $V_{OUT}$ of FIG. 5). As illustrated in plot 600, waveform 602 adequately tracks waveform 606 for positive voltages and waveform 604 adequately tracks waveform 606 for negative voltages.

Figure 8:
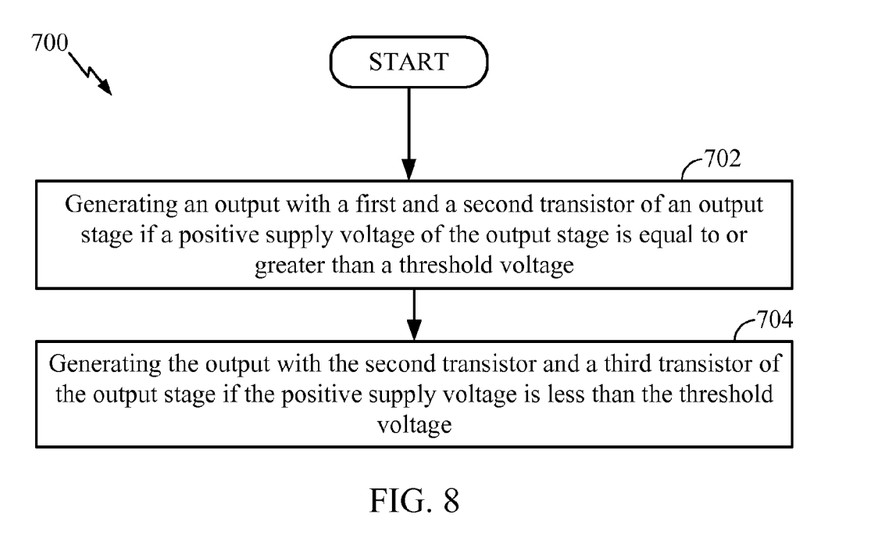
FIG. 8 is a flowchart illustrating a method, according to an exemplary embodiment of the present invention.

FIG. 8 is a flowchart illustrating a method 700, in accordance with one or more exemplary embodiments. Method 700 may include generating an output with a first and a second transistor of an output stage if a positive supply voltage of the output stage is equal to or greater than a threshold voltage (depicted by numeral 702). Method 900 may also include generating the output with the second transistor and a third transistor of the output stage if the positive supply voltage is less than the threshold voltage (depicted by numeral 704).

Figure 9:
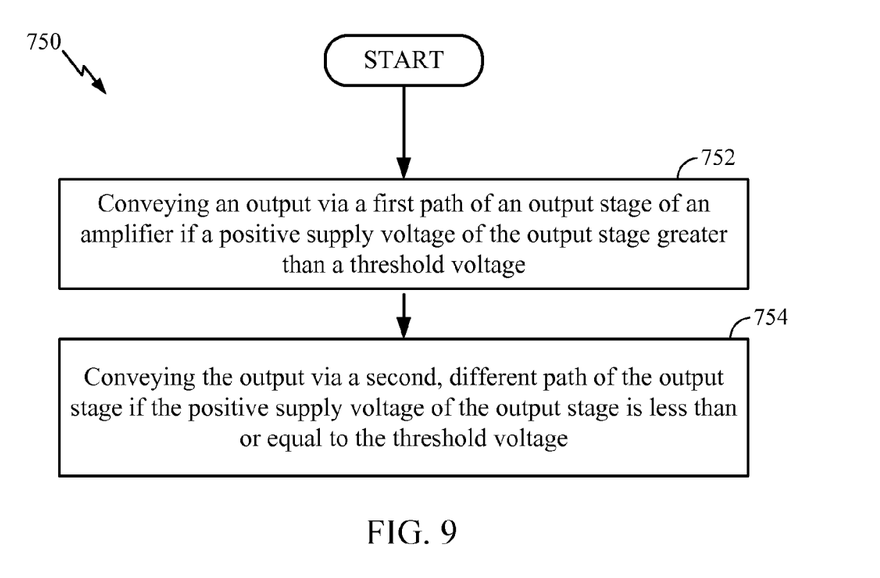
FIG. 9 is a flowchart illustrating another method, according to an exemplary embodiment of the present invention.

FIG. 9 is a flowchart illustrating another method 750, in accordance with one or more exemplary embodiments. Method 750 may include conveying an output via a first path of an output stage of an amplifier if a positive supply voltage of the output stage is greater than a threshold voltage (depicted by numeral 752). Method 750 may also include conveying the output via a second, different path of the output stage if the positive supply voltage of the output stage is less than or equal to the threshold voltage (depicted by numeral 754).

In comparison to a conventional output stage of a power amplifier, which is configured to receive a positive supply voltage $V_{pos}$ equal to approximately 0.45 volts and a negative supply voltage $V_{neg}$ equal to approximately −0.45 volts, the present invention includes a power amplifier, which may operate while receiving a positive supply voltage approximately equal to 0.1 volt or more and a negative supply voltage approximately equal to −0.1 volt or less, thus saving a substantial amount of power.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. An apparatus, comprising:
a first path of an amplifier output stage configured to convey an output signal at an output if a first supply voltage received at the output stage is greater than a threshold voltage, wherein at least a portion of the first path is isolated from the output if the first supply voltage is equal to or less than the threshold voltage; and
a second path of the amplifier output stage configured to convey the output signal to the output if the first supply voltage is equal to or less than the threshold voltage, wherein at least a portion of the second path is isolated from the output if the first supply voltage received at the output stage is greater than the threshold voltage.

2. The apparatus of claim 1, the first path including a first transistor coupled between the first supply voltage and an output, and a second transistor coupled between a second supply voltage and the output, the second path including the second transistor and a third transistor coupled between the first supply voltage and the output.

3. The apparatus of claim 2, further comprising:
at least one transistor for providing a feedback bias current control path for the third transistor; and
at least one transistor for conveying a drive signal to a gate of the third transistor.

4. The apparatus of claim 2, the third transistor having a first terminal coupled to a first terminal of the first transistor and a second terminal coupled to a second terminal of the first transistor and configured to conduct if the first supply voltage is less than or equal to the threshold voltage.

5. The apparatus of claim 2, wherein the third transistor and the second transistor are configured to operate in a conductive state if the first supply voltage is substantially zero volts.

6. The apparatus of claim 2, wherein the first transistor is configured to be in a non-conductive state if the first supply voltage is less than or equal to the threshold voltage.

7. The apparatus of claim 2, further comprising a fourth transistor coupled between the negative supply voltage and a current source and configured to provide a feedback bias current control path for the third transistor.

8. The apparatus of claim 2, further comprising a plurality of transistors configured for conveying a drive signal to a gate of the third transistor.

9. The apparatus of claim 2, the third transistor having a drain coupled to a source of the first transistor and the first supply voltage, and a source coupled to a drain of the first transistor and the output.

10. The apparatus of claim 2, a gate of the third transistor coupled between a drain of a first drive transistor and a drain of a second drive transistor.

11. The apparatus of claim 1, the amplifier further comprising biasing circuitry for controlling a transition from conveying the output signal from one of the first path and the second path to conveying the output signal to the other path.

12. The apparatus of claim 1, the amplifier further comprising biasing circuitry for setting a quiescent current in the output stage.

13. The apparatus of claim 12, the biasing circuitry configured to generate a first scaled current replicating a current through the first transistor, a second scaled current replicating a current through the second transistor, and a third scaled current replicating a current through the third transistor.

14. The apparatus of claim 13, the biasing circuit configured to generate a first bias voltage based on the first scaled current and a second bias voltage based on the second scaled current and the third scaled current.

15. A method, comprising:
conveying an output at an output node via a first path of an output stage of an amplifier if a positive supply voltage received at the output stage is greater than a threshold voltage;
isolating at least a portion of the first path from the output node if the positive supply voltage of the output stage is less than or equal to the threshold voltage;
conveying the output via a second, different path of the output stage if the positive supply voltage of the output stage is less than or equal to the threshold voltage; and
isolating at least a portion of the second, different path from the output node if the positive supply voltage received at the output stage is greater than the threshold voltage.

16. The method of claim 15, wherein conveying the output via a second, different path comprises conveying the output via the second, different path if the positive supply voltage is substantially 0.4 volts or less.

17. The method of claim 15, the conveying an output via a first path comprising generating the output with a first and a second transistor of the output stage and the conveying the output via a second, different path comprising generating the output with the second transistor and a third transistor of the output stage.

18. An apparatus, comprising:
means for conveying an output at an output node via a first path of an output stage of an amplifier if a positive supply voltage received at the output stage is greater than a threshold voltage;
means for isolating at least a portion of the first path from the output node if the positive supply voltage of the output stage is less than or equal to the threshold voltage;
means for conveying the output via a second, different path of the output stage if the positive supply voltage is less than or equal to the threshold voltage; and
means for isolating at least a portion of the second, different path from the output node if the positive supply voltage received at the output stage is greater than the threshold voltage.

19. The apparatus of claim 18, further comprising means for providing a feedback bias current control path for the output stage.

20. The apparatus of claim 18, further comprising means for setting a quiescent current in the output stage including means for generating a scaled current replicating a current through the second, different path.

\* \* \* \* \*